United States Patent [19]

Oogaki et al.

[11] Patent Number: 4,621,304
[45] Date of Patent: Nov. 4, 1986

[54] HEAT RADIATOR ASSEMBLY
[75] Inventors: Kenji Oogaki; Hiroshi Sato, both of Hyogo, Japan
[73] Assignee: Mitsubishi Denki Kabushiki Kaisha, Tokyo, Japan
[21] Appl. No.: 595,556
[22] Filed: Mar. 30, 1984
[30] Foreign Application Priority Data Mar. 31, 1983 [JP] Japan ............................ 58-49050[U]
Mar. 31, 1983 [JP] Japan ............................ 58-49051[U]
Mar. 31, 1983 [JP] Japan ............................ 58-49052[U]

[51] Int. Cl.⁴ ............................................. H05K 7/20
[52] U.S. Cl. .................................... 361/386; 165/185; 174/16 HS; 361/388
[58] Field of Search ...................... 165/80.2, 80.3, 185; 174/16 HS; 357/79, 81; 361/380, 381, 383, 386, 388, 389, 424

[56] References Cited
U.S. PATENT DOCUMENTS 2,313,379  3/1943  Wood ................................. 165/185
3,229,756  1/1966  Keresztury ......................... 361/388
4,069,498  1/1978  Joshi ............................... 174/16 HS
4,167,031  9/1979  Patel ............................... 174/16 HS
4,254,431  3/1981  Babuka ................................ 357/79

OTHER PUBLICATIONS

Ronkese, "Metal Wood Heat Stud", IBM Technical Disclosure Bulletin, vol. 20, No. 3, 8/77, pp. 1122-1123.
Bakos et al, "Programmable Heat Sink Device for Thermal Enhancement", IBM Technical Disclosure Bulletin, vol. 22, No. 3, 8/79, p. 957.
Doo et al, "Controlled Gap in Semiconductor Packages", IBM Technical Disclosure Bulletin, vol. 20, No. 4, 9/77, p. 1433.
Parsapour, "Hook and Loop Thermal Conductive Mesh", IBM Technical Disclosure Bulletin, vol. 21, No. 9, 2/79, p. 3672.
Darrow et al, "Stack Structure for Mixed Technology Thermal Enhancement", IBM Technical Disclosure Bulletin, vol. 22, No. 3, 8/79, pp. 958-959.

Primary Examiner—A. D. Pellinen
Assistant Examiner—Gregory D. Thompson
Attorney, Agent, or Firm—Bernard, Rothwell & Brown

[57] ABSTRACT

A heat radiator assembly conducts the heat generated by electronic parts mounted on a printed board, such as integrated circuits, resistors, and semiconductor elements, through first and second heat sinks to a shield case, so that the heat is radiated therefrom and thus natural air cooling is effected. The first heat sink is provided on the shield case, and the second heat sink is passed through a through hole in the shield case and the first heat sink and is threadedly engaged with the first heat sink, to engage the electronic parts. If necessary, a lock nut or a lock screw may be used for fixing the threaded engagement of the second heat sink.

4 Claims, 10 Drawing Figures

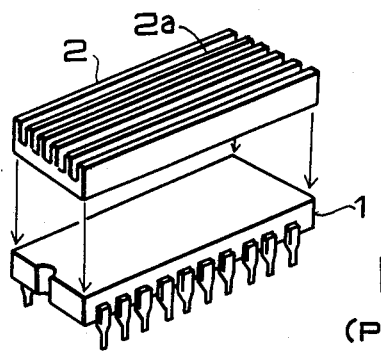
FIG. 1 (PRIOR ART)
FIG. 2 (PRIOR ART)
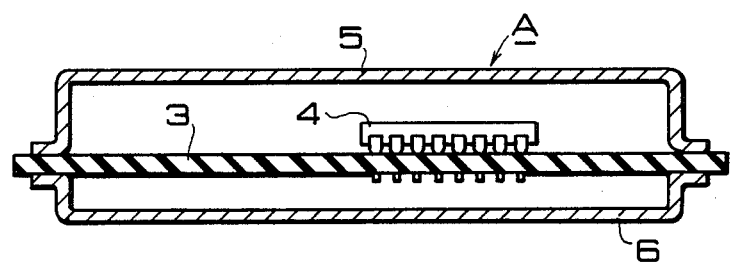
FIG. 3
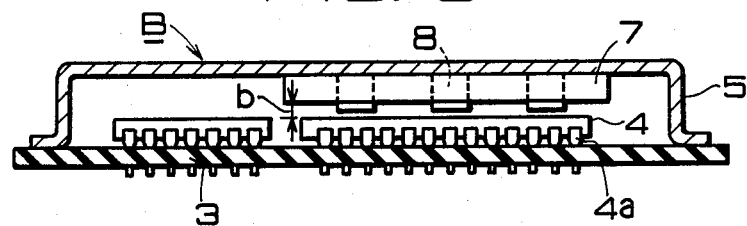
FIG. 4
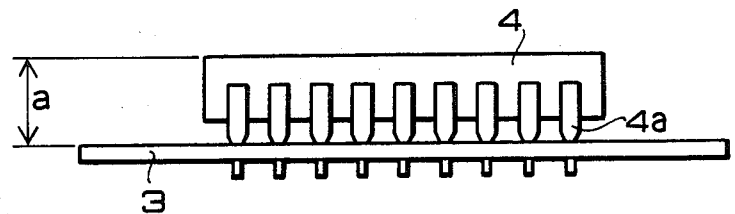

HEAT RADIATOR ASSEMBLY

BACKGROUND OF THE INVENTION

1. Field of the Invention

The present invention relates to a heat radiator assembly for cooling high calorific electronic parts, such as integrated circuits, resistors, and semiconductor elements, mounted on a printed board or the like.

2. Description of the Prior Art

With the recent increase in speed of functioning of semiconductor elements and advancement in the degree of integration, the electric power consumed by a single element has become so large that there are increasing instances where an element becomes highly heated by the heat generated by itself to lower the reliability. According to Arrhenius' principle, the reliability of an element decreases to about half with the increase of about 10 degrees in temperature.

Accordingly, there has been practised forced air cooling with the use of a fan, which, however, has made it necessary to replace the fan periodically because of its life span. For this reason, instead of forced air cooling by a fan, the demand for natural air cooling by natural convection or the like is becoming greater. In such a case where an assembly is installed in a mountainous region where maintenance for replacing the fan is practically impossible, the natural air cooling will be the only way available.

The heat radiation to cool the calorific element is effected by heat transfer from the surface of the heated portion to the surrounding air. Namely, if the resistance of heat transfer between the surface of the heated element and the surrounding air is low, then the heat is well transferred. Therefore, by lowering the heat transfer resistance to the air, better cooling of the heated element is effected. In order to lower the heat transfer resistance to the air, the method to enlarge the surface in contact with the air, i.e. the surface area, has so far been employed.

As a device to achieve the above-stated effect, such one as shown in FIG. 1 has so far been used. In FIG. 1, reference numeral 1 denotes an integrated circuit, IC; the one shown there is of Dual-In-Line package type. Reference numeral 2 denotes a radiating fin, which is made of copper, aluminum, or the like, having good heat conductivity, and the radiating fin is provided with fine grooves 2a on the top face thereof to magnify the surface area in contact with the air. The radiating fin 2 is attached to the top face of the IC 1, a calorific element, with adhesive, as indicated by arrows. The heat generated by the IC 1 is thus conducted to the radiating fin 2 for cooling.

The method to attach the radiating fin 2 directly to the high calorific element IC 1 appears to be effective upon initial consideration, but it involves various problems in reality. Firstly, the direction of the grooves to magnify the surface area of the radiating fin 2 must be in the direction of the air flow. By this arrangement to improve the radiation effect, the direction of the IC 1 to be mounted on the printed board is restricted to be in one direction. As a result, the wiring pattern on the printed board is also subject to restriction.

Secondly, the adhesive used for attaching the radiating fin 2 to IC 1 involves problems. The adhesive must be of the thermal expansion coefficient that conforms to that of the material of the radiating fin 2, e.g. copper, or silver, and that of the package material, e.g. plastic, or ceramic. Besides, the adhesive must endure the thermal stress for a long time, so that the radiating fin 2 is held securely attached to the IC 1. Since such adhesives are expensive and none of them is completely effective at present, in such a construction where the radiating fin 2 is attached to the IC 1 with adhesive, the radiating fin 2 is liable to be separated from the IC 1 when mounted on the printed board subject to vibration or shock, so that such a construction can only be used where there is little or no vibration or shock.

Electronic parts recently used are highly integrated and the elements are manufactured by minute producing technology, and therefore there is an increasing danger that the element may be broken down by electric potential due to static electricity from a human body or the like. For example, C-MOS elements and ordinary MOS elements are the electronic parts that are highly susceptible to be broken down by static electricity. To prevent the electrostatic breakdown of such electronic parts when the same are mounted on a printed board, it is a practice to shield it with a metal case A as shown in FIG. 2. In this case, however, there is a problem that the electronic parts 4 are confined in a narrow space surrounded by the top shield cover 5 and the printed board 3, and therefore the heat emitted from the electronic parts 4 cannot be effectively radiated. Reference numeral 6 denotes a bottom shield cover. Accordingly, the shield case A covers the printed board 3 to prevent the mounted electronic parts 4 from electrostatic breakdown and mechanical damage, but the same has an adverse effect on the electronic parts 4 in the aspect of cooling or heat radiation.

In the conventional heat radiator assemblies as stated above, there have been such disadvantages that the mounting direction of electronic parts has been subject to restriction, or separation of units at the portion where adhesive was applied has been liable to occur, in the case where a radiating fin was attached to electronic parts mounted on a printed board with adhesive, or effective heat radiation from electronic parts to cool the same has been impossible in the case where shielding with a metal case was applied for protection of electronic parts from static electricity.

SUMMARY OF THE INVENTION

It is a primary object of the present invention to provide a heat radiator assembly for cooling calorific electronic parts mounted on a printed board such as ICs, resistors and semiconductor elements.

The radiator assembly is constructed in such a way that a first heat sink is provided on a shield case for protecting electronic parts mounted on a printed board, and a second heat sink is engagedly held by the first heat sink so as to be in contact with the electronic parts.

Therefore, a positive cooling effect is achieved regardless of mounting conditions of the electronic parts.

BRIEF DESCRIPTION OF THE DRAWINGS

FIG. 1 is a perspective view of a conventional heat radiator assembly for an IC.

FIG. 2 is a sectional view of a shield case for protecting a printed board with an IC mounted thereon.

FIG. 3 is a sectional view of an embodiment of the heat radiator assembly in accordance with the present invention.

FIG. 4 is a drawing indicating the condition of an IC mounted on a printed board.

DESCRIPTION OF THE PREFERRED EMBODIMENT

Figure 5:
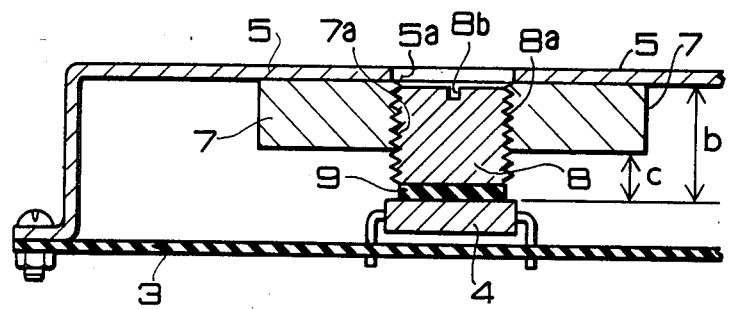
FIG. 5 is a detailed drawing indicating an embodiment concerning an essential part of the assembly as indicated in FIG. 3.

FIG. 3 is a sectional view of an embodiment of the present invention. Referring to the drawing, reference numeral 3 denotes a printed board, 4 denotes electronic parts such as an IC, 4a denotes a terminal lead pin, and 5 denotes a top shield case; 7 denotes a first heat sink provided on the shield case 5, and 8 denotes a second heat sink engagedly held by the first heat sink, both heat sinks having heat conductivity. When the electronic parts 4, mounted on the printed board 3 and protected by the shield case 5, generate heat, the space inside the case is heated to a high temperature. However, since the second heat sink 8 is in contact with the electronic parts 4, the heat generated by the electronic parts 4 is conducted thereby to the first heat sink 7, and the heat is further conducted from the first heat sink 7 to the shield case 5. The heat from the electronic parts 4 is thus conducted to the shield case 5, and then the shield case 5, which is exposed to the ambient air and has a much larger surface area than the electronic parts 4, meaning that the same has a lower heat transfer resistance to the air, transfers the heat from the electronic parts 4 to the ambient air thereby to cool the same. Here, it is naturally assumed that the temperature of the ambient air is lower than the temperature of the electronic parts 4.

By conducting the heat from the electronic parts 4 through the first heat sink 7 and the second heat sink 8 to the shield case 5 in the way as described above, the surface area of the shield case 5 can be utilized effectively.

Referring now to FIG. 4, the height (a) from the surface of the printed board 3 to the top surface of the electronic parts 4 mounted thereon varies depending on the set of the electronic parts 4 and also on each manner in which the electronic parts 4 are mounted on the printed board. Namely, the height (a) from the surface of the printed board 3 on which the parts are mounted to the top surface of the package of the electronic parts 4 takes various values even in one printed board. In the case where the shield case 5 is attached to the printed board 3 on which such electronic parts 4 are mounted, the distance between the shield case 5 and the top surface of the electronic parts 4 is not constant but takes various values. Therefore, it becomes necessary to devise a construction of the heat radiator assembly which in any case achieves positive contact with the top surface of the package of the electronic parts 4 to conduct the heat on the package surface to the shield case 5. To achieve this, a construction of the heat sink as indicated in FIG. 5 is provided to adjust the height (b), details of which will be described in the following.

Figure 6:
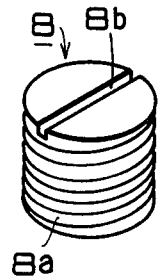
FIG. 6 is a perspective view of a second heat sink as indicated in FIG. 5.

FIG. 5 is a sectional view of the essential part of the assembly as indicated in FIG. 3, and FIG. 6 is a perspective view of the essential part as indicated in FIG. 5. As indicated in FIG. 6, the second heat sink 8 is of cylindrical shape and provided with a thread 8a on the periphery thereof and with a slot 8b on the top face thereof so as to be driven by a screwdriver. The first heat sink 7 attached to the shield case 5 is provided with a female thread 7a, as indicated in FIG. 5, so that the threaded heat sink 8 can be engaged therewith. The threaded heat sink 8 is adapted to be threadedly engaged with the female thread 7a of the heat sink 7 from above the shield case 5, to which the heat sink 7 is attached, through a hole 5a. Reference numeral 9 denotes a heat conductive rubber.

Functions of the embodiment of the construction as described above will be explained in the following. First, the threaded heat sink 8 is passed through the hole 5a at the top of the shield case 5 and threadedly engaged with the threaded portion 7a of the heat sink 7. The heat sink 8 is pressed against the electronic parts 4. In order to make smooth the contact and the heat conduction between the threaded heat sink 8 and the electronic parts 4, a rubber 9 with good heat conductivity may be previously attached to the former at its portion which contacts the latter. In such a case, the threaded heat sink 8 contacts with the electronic parts 4 through the rubber 9. Thus, any variation in the distance (c) between the electronic parts 4 and the heat sink 7 can be minutely compensated with ease by turning the threaded heat sink 8. Meanwhile, the heat sink 7 and the threaded heat sink 8 are in threaded contact and therefore the surface of contact between them is magnified, so that the heat conducted from the electronic parts 4 through the rubber 9 to the threaded heat sink 8 is easily conducted to the heat sink 7, and emitted to the ambient air through the shield case 5. As described in the foregoing, no matter how varied the distances between the first heat sink 7 and the electronic parts 4 may be, sufficient pressure of contact and surface of contact for good heat conductivity is always obtained by virtue of the second heat sink 8.

In case the heat radiator assembly as described in the above embodiment is installed in a severe environment where strong vibration, shock, or the like is exerted on the assembly to loosen the threaded engagement of the second heat sink 8 with the first heat sink 7 thereby causing a non-contact between the second heat sink 8 and the electronic parts 4, then means for preventing the second heat sink 8 from being loosened, that is, for fixing the same in place, is demanded.

Figure 7:
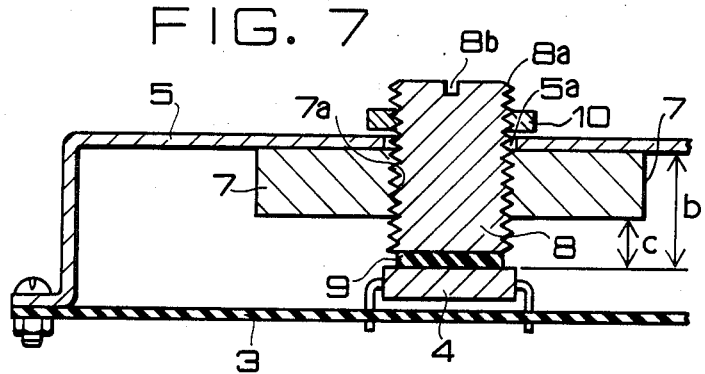
FIGS. 7 and 9 are detailed drawings indicating other embodiments concerning the essential part of the assembly as indicated in FIG. 3.
Figure 9:
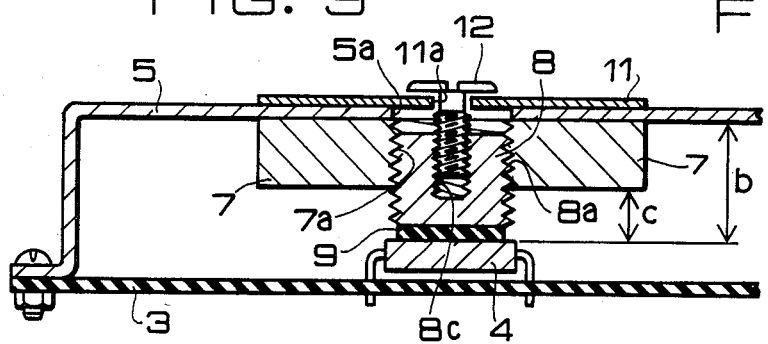

Indicated in FIGS. 7 and 9 are other embodiments of the present invention which are provided with such lock means as mentioned in the foregoing.

Figure 8:
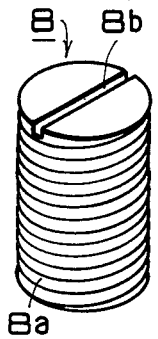
FIGS. 8 and 10 are perspective views of the second heat sink as indicated in FIGS. 7 and 9, respectively.

Firstly, in the embodiment indicated in FIG. 7, the threaded heat sink 8, outwardly projecting through the hole 5a in the shield case 5, is threadedly engaged with a lock nut 10. That is, the lock nut 10 is fitted from above to the threaded heat sink 8 to fix the same in place. By tightening the lock nut 10, the threaded heat sink 8 is pulled up toward the shield case 5 to prevent the threaded heat sink 8 from being loosened. In this case, the threaded heat sink 8 must be made larger in its length, as indicated in FIG. 8, than that as indicated in FIG. 6.

Figure 10:
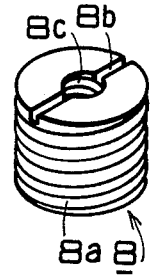

Then, in the embodiment indicated in FIG. 9, a lock screw 12, passing through a fixed plate 11 provided on the shield case 5, is threadedly engaged with the threaded heat sink 8. Namely, the fixed plate 11 is provided on the shield case 5 and the lock screw 12 is inserted, from above the fixed plate 11 through the hole 11a and screwed into the female thread 8c provided in the threaded heat sink 8 for fixing the same. By tightening the lock screw 12, the threaded heat sink 8 is pulled up toward the fixed plate 11 to prevent the threaded heat sink 8 from being loosened. In this case, the threaded heat sink 8, being the second heat sink, is provided with a female thread 8c, as indicated in FIG. 10, into which the lock screw 12 is screwed.

By the use of the lock nut 10 or the lock screw 12 as indicated in FIG. 7 or FIG. 9, the second heat sink 8 is fixed in place, so that the contact between the second heat sink 8 and the electronic parts 4 is securely and positively maintained under such external disturbances as vibration and shock.

Besides, heat emission is effected through the lock nut 10 or the lock screw 12.

In the description of each embodiment given in the foregoing, a heat conductive rubber 9 is used between the threaded heat sink 8 and the electronic parts 4, but the same may be eliminated. And, only the cases where one each of the first heat sink 7 and the second heat sink 8 are used were mentioned in the foregoing, but a plurality of them may be used. Furthermore, in the above, the shield case 5 and the heat sink 7 were indicated as separate parts but they may be of an integrated construction.

What is claimed is:

1. A heat radiator assembly comprising a shield case which protects electronic parts mounted on a board, a first heat sink provided on said shield case, and a second heat sink engagedly held by said first heat sink so as to contact with said electronic parts, said shield case having a hole therein, said first heat sink having a threaded hole therein aligned with said hole in said shield case, said second heat sink being received through said hole in said shield case, and said second heat sink being threadedly engaged with said threaded hole in said first heat sink in heat transfer relation therewith.

2. A heat radiator assembly in accordance with claim 1, wherein said second heat sink has a portion projecting outwardly beyond said hole in said shield case, and further including a lock nut, said lock nut threadedly engaging said portion of said second heat sink, thereby fixing said second heat sink in engagement with said electronic parts.

3. A heat radiator assembly in accordance with claim 1, wherein a fixed plate is mounted on the exterior of said shield case, said fixed plate having an opening therein aligned with said hole in said shield case, and a lock screw for fixing said second heat sink in engagement with said electronic parts is passed through said opening in said fixed plate and threadedly engaged with said second heat sink.

4. A heat radiator assembly in accordance with any of claim 1, 2, or 3, wherein said second heat sink is provided with a heat conductive rubber attached to one end of said second heat sink, said heat conductive rubber engaging said electronics parts.

* * * * *